US012568687B2

(12) United States Patent
Watakabe et al.

(10) Patent No.: US 12,568,687 B2
(45) Date of Patent: Mar. 3, 2026

(54) SEMICONDUCTOR DEVICE

(71) Applicant: Magnolia White Corporation, Tokyo (JP)

(72) Inventors: Hajime Watakabe, Tokyo (JP); Kentaro Miura, Tokyo (JP); Akihiro Hanada, Tokyo (JP)

(73) Assignee: MAGNOLIA WHITE CORPORATION, Tokyo (JP)

( * ) Notice: Subject to any disclaimer, the term of this patent is extended or adjusted under 35 U.S.C. 154(b) by 547 days.

(21) Appl. No.: 17/583,231

(22) Filed: Jan. 25, 2022

(65) Prior Publication Data

US 2022/0238558 A1 Jul. 28, 2022

(30) Foreign Application Priority Data

Jan. 25, 2021 (JP) ................................. 2021-009377

(51) Int. Cl.
H10D 86/60 (2025.01)
H10D 30/67 (2025.01)
(Continued)

(52) U.S. Cl.
CPC ......... H10D 86/60 (2025.01); H10D 30/6723 (2025.01); H10D 30/6731 (2025.01);
(Continued)

(58) Field of Classification Search
CPC .............. H01L 27/124; H01L 27/1225; H01L 27/1251; H01L 27/1259; H01L 29/78633;
(Continued)

(56) References Cited

U.S. PATENT DOCUMENTS

| | | | | |
|---|---|---|---|---|
| 2006/0255345 A1* | 11/2006 | Sakakura | ............. | H10D 86/021 |
| | | | | 257/E33.066 |
| 2009/0026450 A1* | 1/2009 | Lee | ..................... | H01L 27/1225 |
| | | | | 257/E21.597 |

(Continued)

FOREIGN PATENT DOCUMENTS

| | | |
|---|---|---|
| CN | 110323230 A | 10/2019 |
| JP | 2017-183312 A | 10/2017 |
| JP | 2020-129635 A | 8/2020 |

OTHER PUBLICATIONS

Chinese Office Action issued Oct. 31, 2024, in corresponding Chinese Patent Application No. 202210074605.X, 7pp.

(Continued)

*Primary Examiner* — Jessica S Manno
*Assistant Examiner* — Andrew Chung
(74) *Attorney, Agent, or Firm* — XSENSUS LLP

(57) ABSTRACT

According to one embodiment, a semiconductor device includes an insulating substrate, a polycrystalline silicon semiconductor, an oxide semiconductor, a gate electrode located directly above the oxide semiconductor, a first conductive layer in contact with the polycrystalline silicon semiconductor via a first contact hole, and in contact with the oxide semiconductor via a second contact hole and a second conductive layer stacked on the first conductive layer between the first contact hole and the second contact hole. The first conductive layer includes an extending portion extending from the second contact hole toward the gate electrode. The second conductive layer is not stacked on the extending portion. The first conductive layer is thinner than the second conductive layer.

18 Claims, 8 Drawing Sheets

(51) Int. Cl.
| | |
|---|---|
| *H10D 86/01* | (2025.01) |
| *H10D 86/40* | (2025.01) |

(52) U.S. Cl.
CPC ..... *H10D 30/6745* (2025.01); *H10D 30/6755* (2025.01); *H10D 86/021* (2025.01); *H10D 86/423* (2025.01); *H10D 86/441* (2025.01); *H10D 86/471* (2025.01)

(58) Field of Classification Search
CPC ........... H01L 29/78675; H01L 29/7869; H01L 29/78693; H01L 21/8221; H01L 27/0688; H01L 23/482–4822; H01L 23/485; H01L 23/4855; H10D 86/60; H10D 86/471; H10D 86/441; H10D 86/021; H10D 86/423; H10D 30/6731; H10D 30/6745; H10D 30/6723; H10D 30/6755; H10D 30/6756; H10D 84/038; H10D 88/00; H10D 88/01

See application file for complete search history.

(56) References Cited

U.S. PATENT DOCUMENTS

| | | |
|---|---|---|
| 2017/0278872 A1 | 9/2017 | Ohara |
| 2020/0259020 A1 | 8/2020 | Watakabe et al. |
| 2021/0241689 A1* | 8/2021 | Lee ..................... G09G 3/3233 |

OTHER PUBLICATIONS

Chinese Office Action issued May 9, 2025, in corresponding Chinese Patent Application No. 202210085605.X, 8 pages.

* cited by examiner

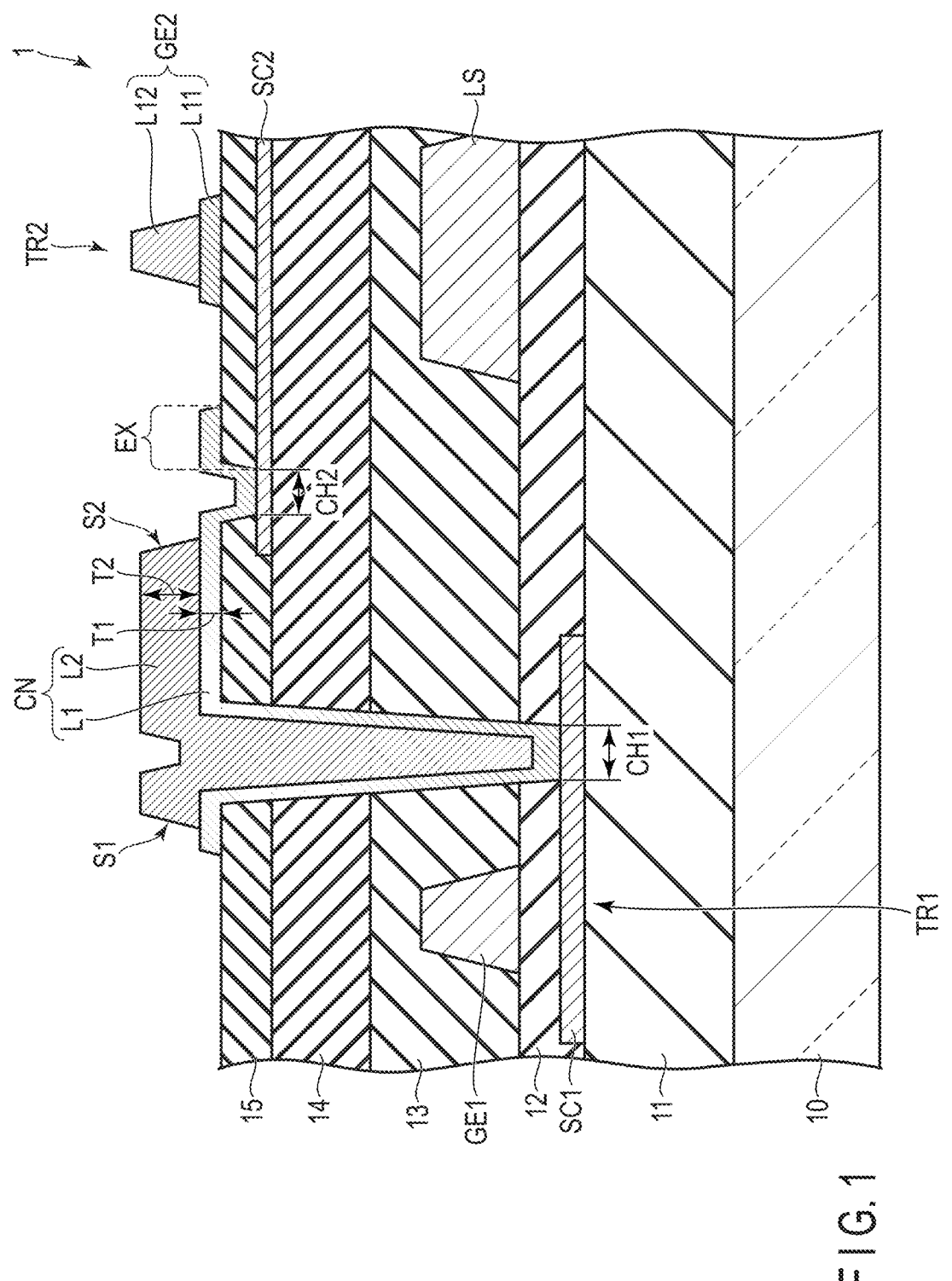
F I G. 1

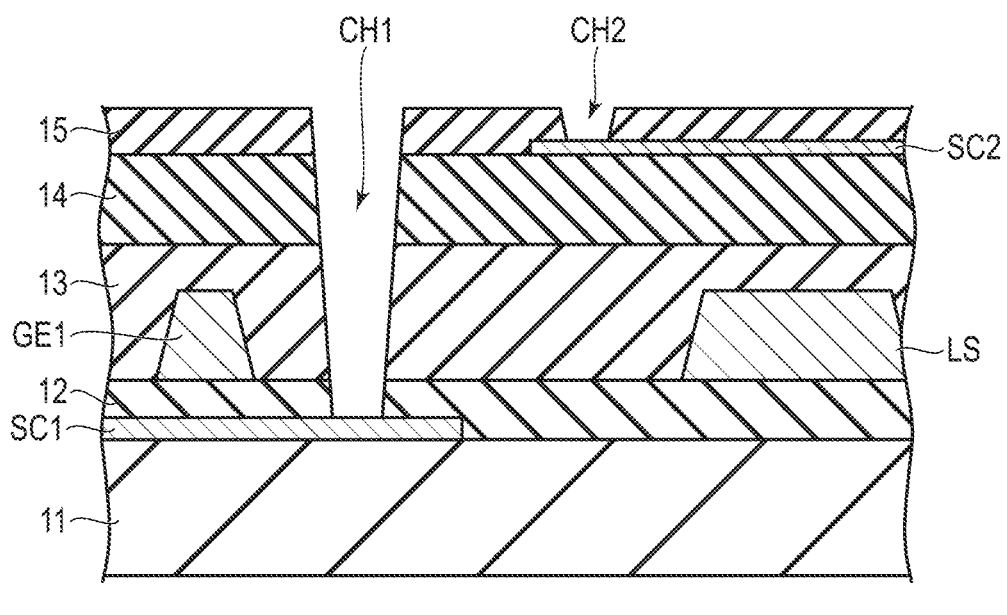
F I G. 2
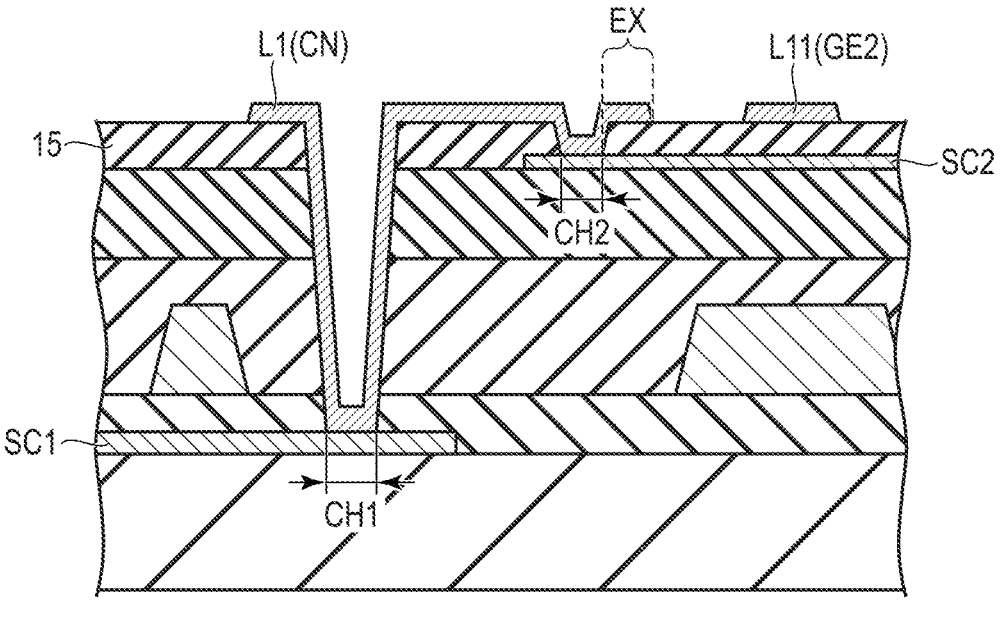
F I G. 3

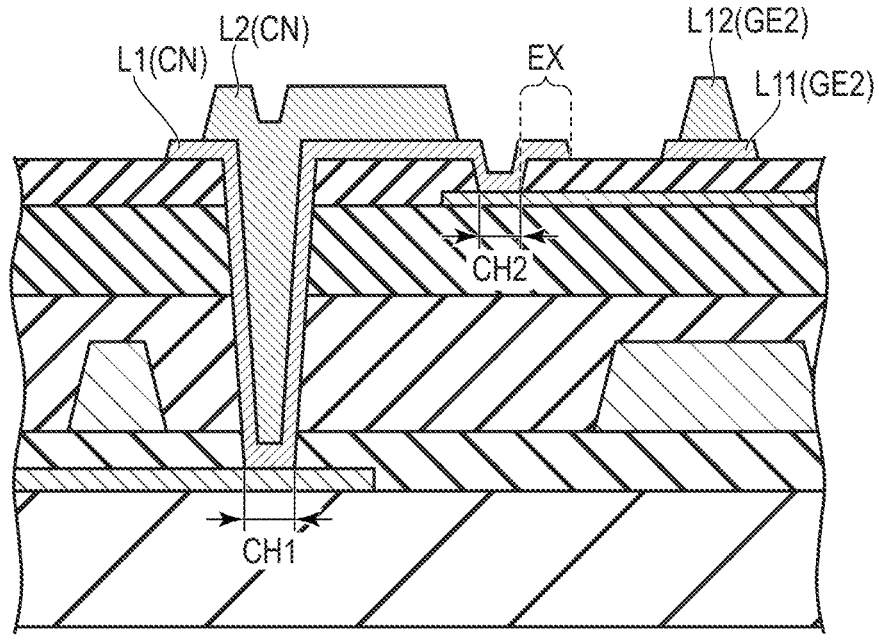
F I G. 4

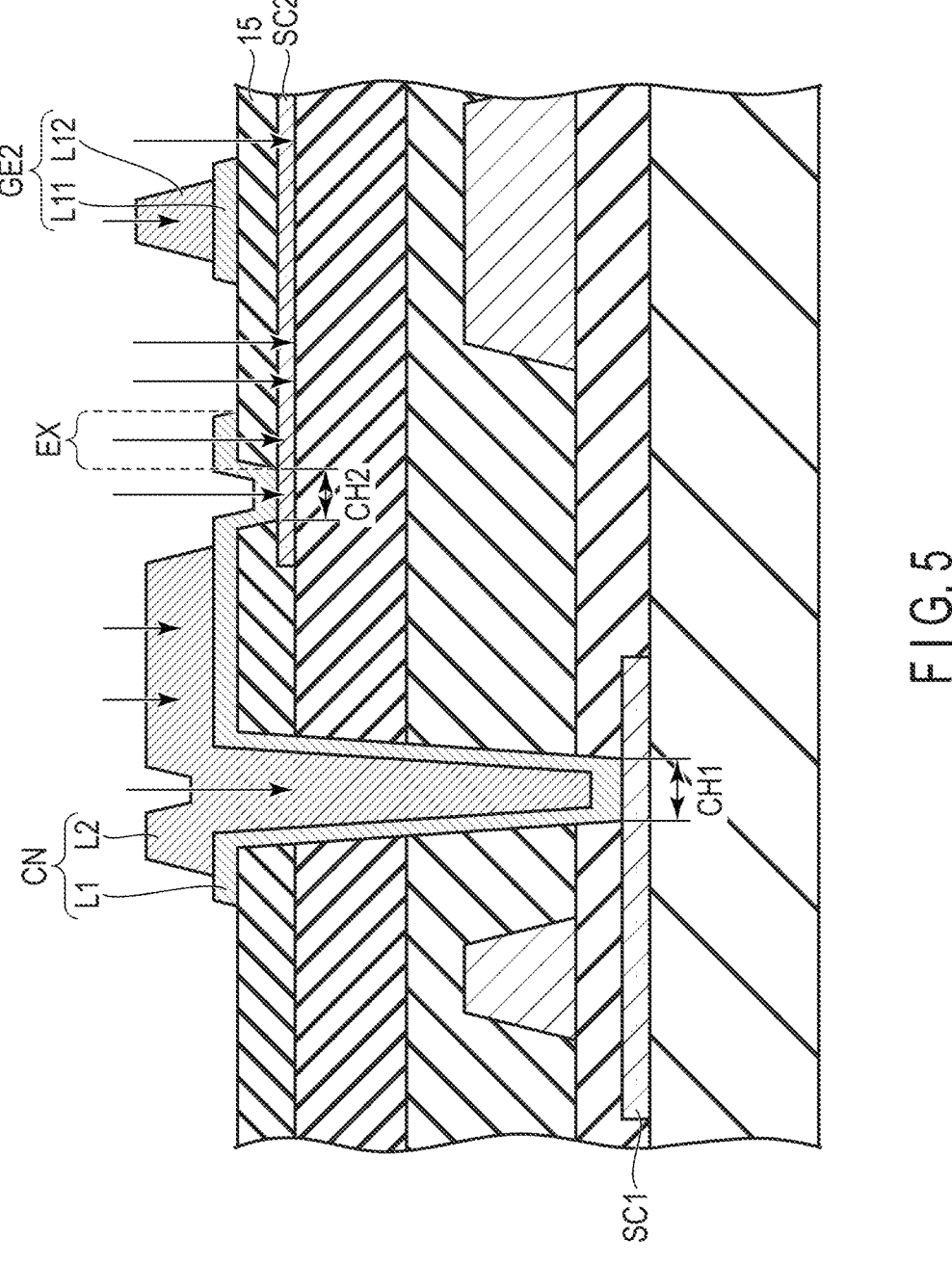
F I G. 5

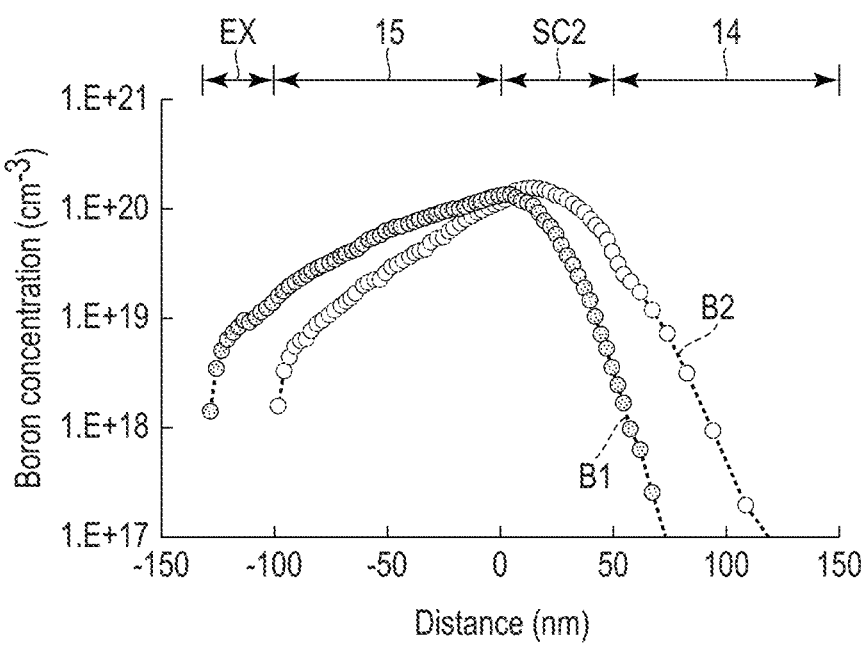
F I G. 7
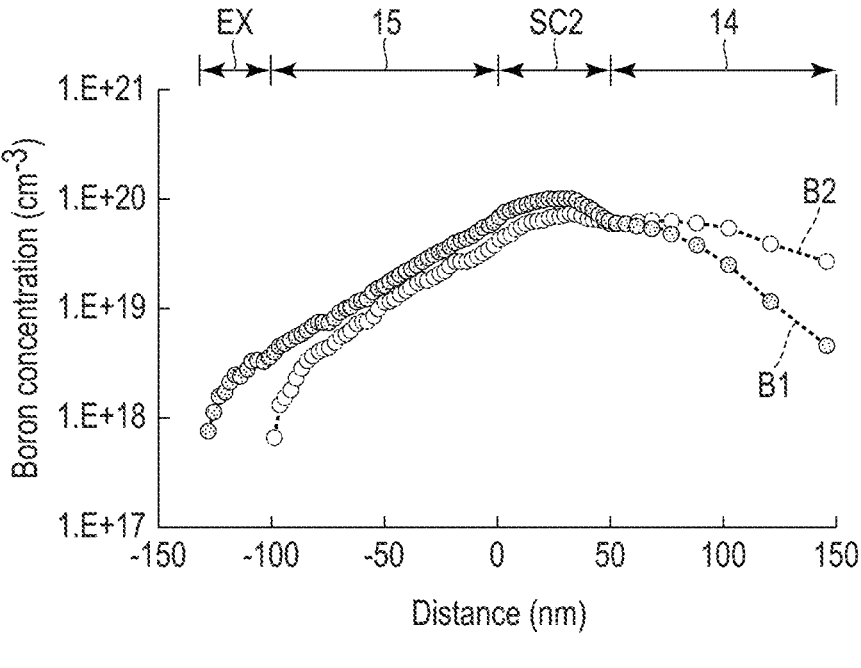
F I G. 8

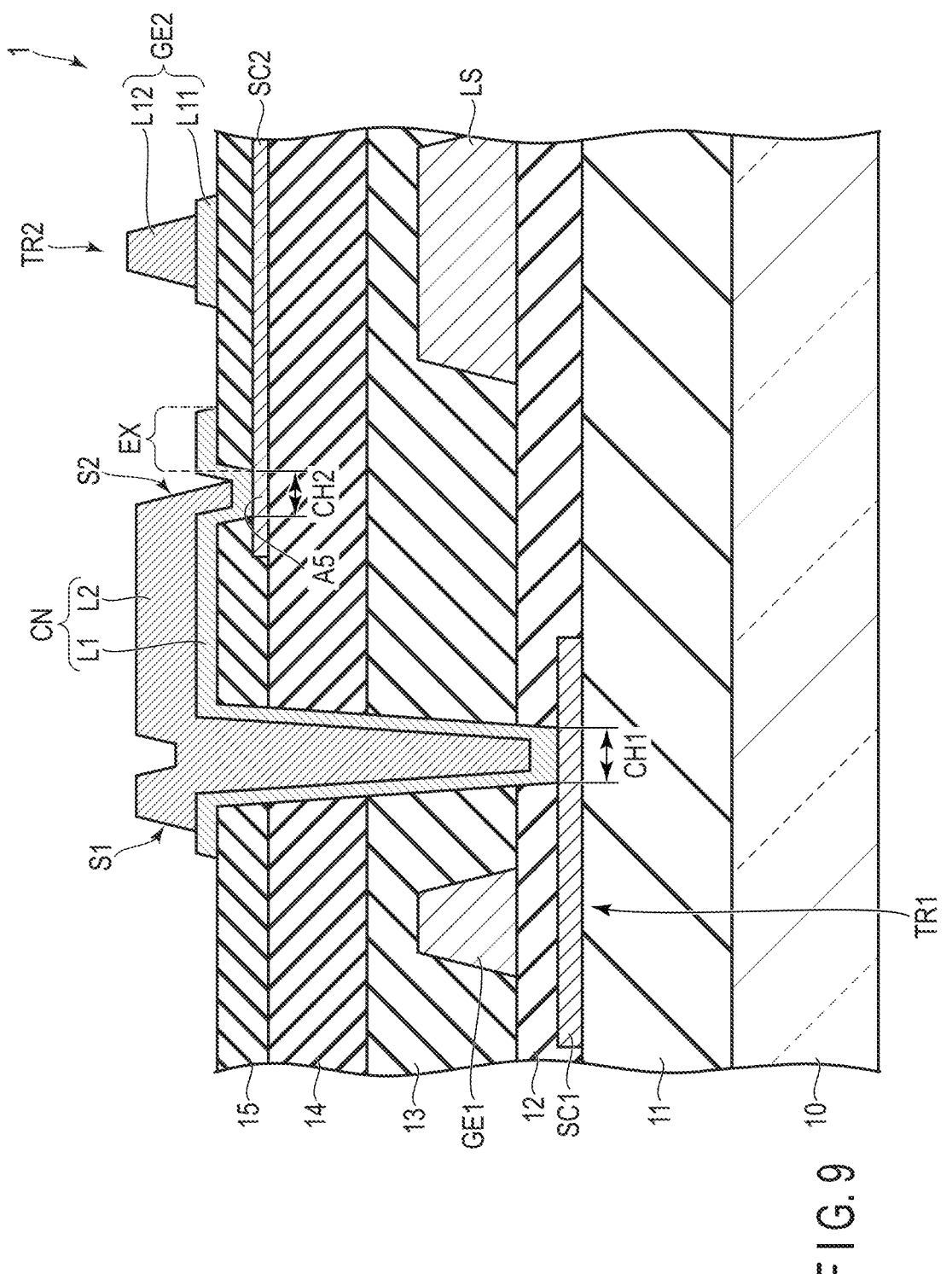
F I G. 9

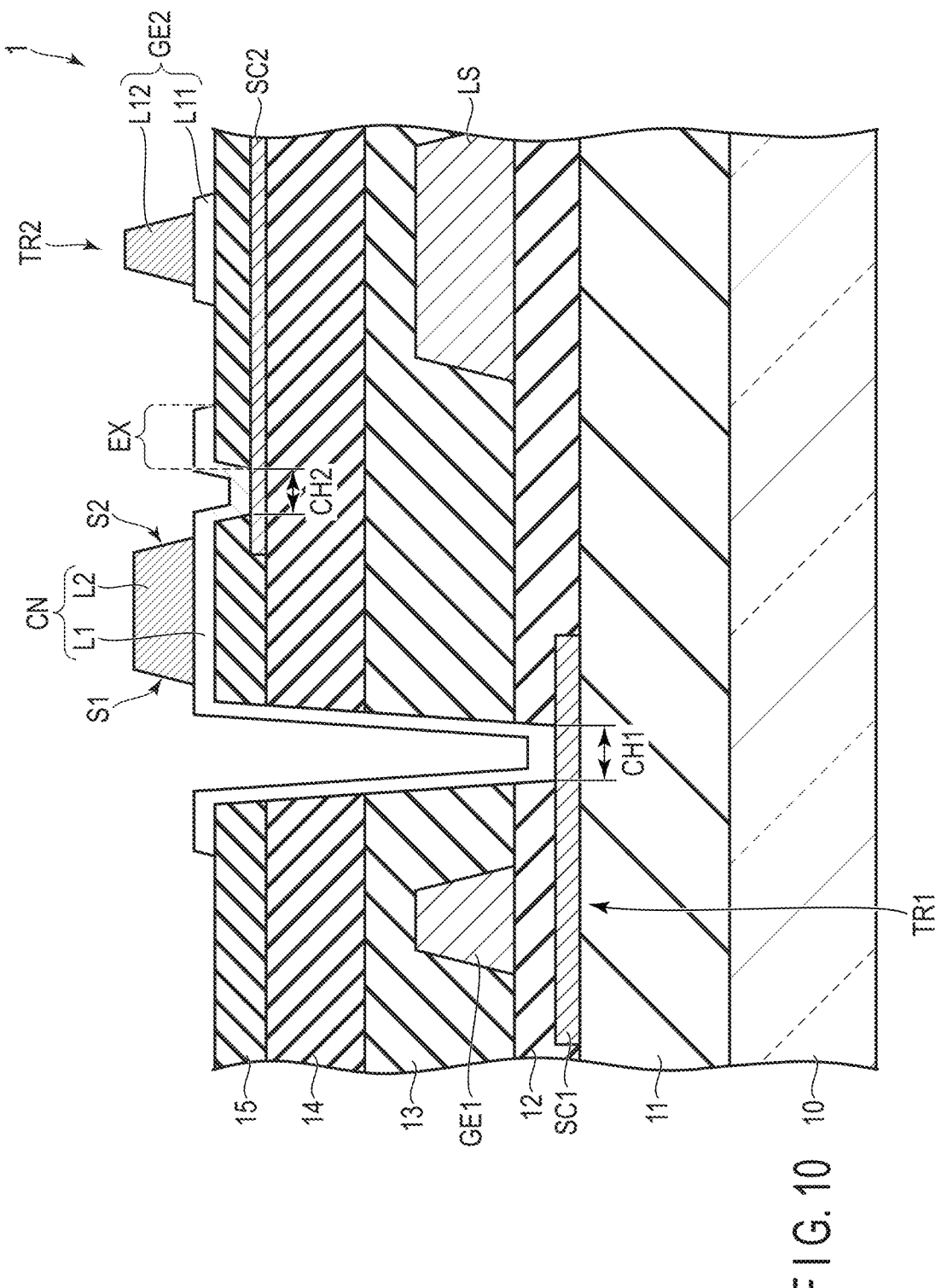
F I G. 10

SEMICONDUCTOR DEVICE

CROSS-REFERENCE TO RELATED APPLICATIONS

This application is based upon and claims the benefit of priority from Japanese Patent Application No. 2021-009377, filed Jan. 25, 2021, the entire contents of which are incorporated herein by reference.

FIELD

Embodiments described herein relate generally to a semiconductor device.

BACKGROUND

For example, in the field of the liquid crystal display, such a technology has been proposed that a transistor comprising an oxide semiconductor is provided in a pixel circuit in a display area and a transistor comprising a silicon semiconductor is provided in a drive circuit in a peripheral area.

BRIEF DESCRIPTION OF THE DRAWINGS

FIG. 1 is a cross-sectional view showing a configuration example of a semiconductor device 1 according to an embodiment.

FIG. 2 is a diagram illustrating a method of manufacturing a transistor TR1 and a transistor TR2.

FIG. 3 is a diagram illustrating the method of manufacturing the transistor TR1 and the transistor TR2.

FIG. 4 is a diagram illustrating the method of manufacturing the transistor TR1 and the transistor TR2.

FIG. 5 is a diagram illustrating the method of manufacturing the transistor TR1 and the transistor TR2.

FIG. 7 is a diagram showing results of a first simulation.

FIG. 8 is a diagram showing results of a second simulation.

FIG. 9 is a cross-sectional view of another configuration example of the semiconductor device 1 of this embodiment.

FIG. 10 is a cross-sectional view showing another configuration example of the semiconductor device 1 of this embodiment.

DETAILED DESCRIPTION

Figure 6:
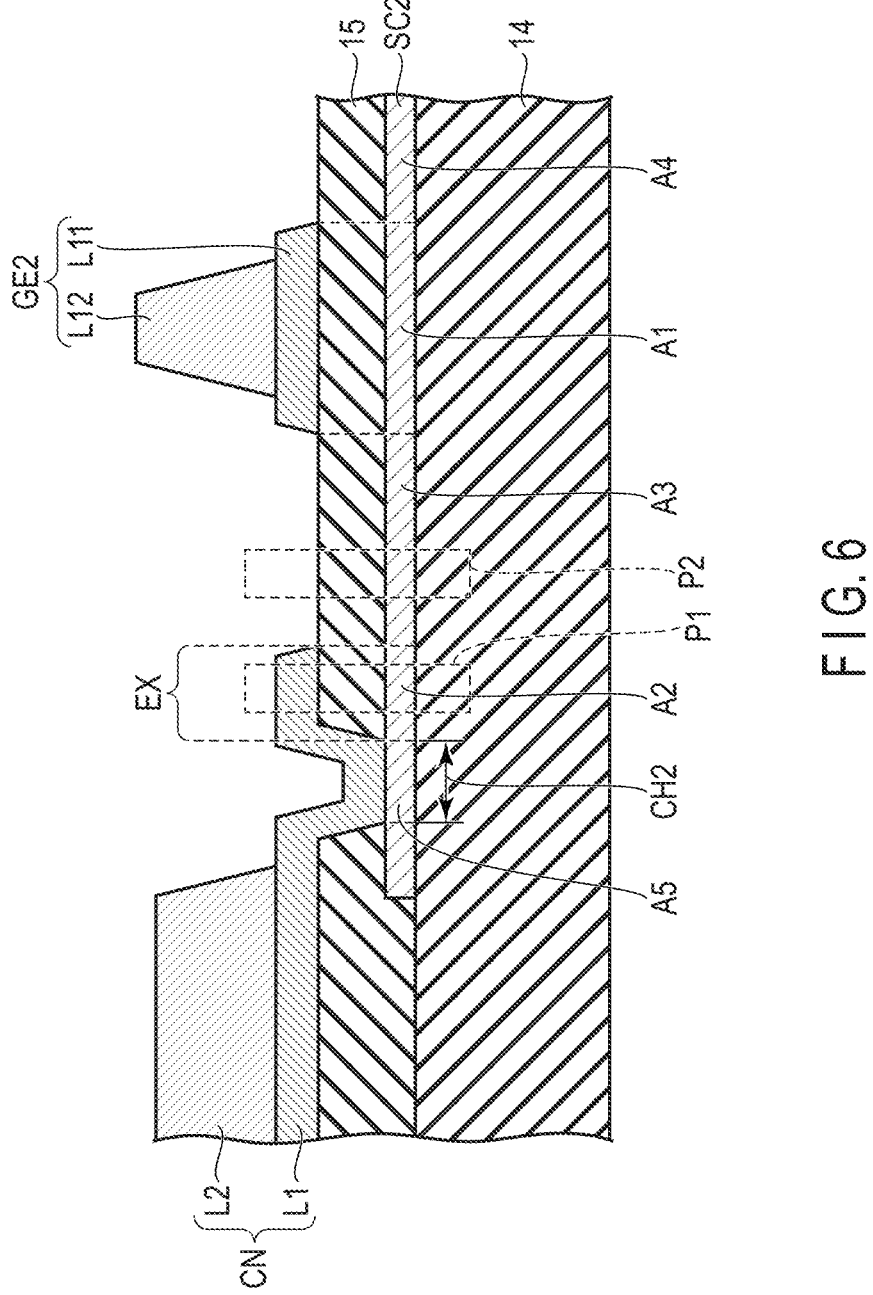
FIG. 6 is a cross-sectional view of a semiconductor SC2 after implanting an impurity.

An object to the embodiments is to provide a semiconductor device which can suppress degradation in performance of the transistor.

In general, according to one embodiment, a semiconductor device comprises an insulating substrate, a first insulating layer disposed above the insulating substrate, a polycrystalline silicon semiconductor disposed on the first insulating layer, an intermediate insulating layer disposed on the polycrystalline silicon semiconductor, an oxide semiconductor disposed on the intermediate insulating layer, a second insulating layer disposed on the intermediate insulating layer and the oxide semiconductor, a gate electrode disposed on the second insulating layer and located directly above the oxide semiconductor, a first conductive layer in contact with the polycrystalline silicon semiconductor via a first contact hole penetrating the intermediate insulating layer and the second insulating layer, and in contact with the oxide semiconductor via a second contact hole penetrating the second insulating layer and a second conductive layer stacked on the first conductive layer between the first contact hole and the second contact hole, and the first conductive layer includes an extending portion extending from the second contact hole toward the gate electrode, the second conductive layer is not stacked on the extending portion, and a film thickness of the first conductive layer is less than a film thickness of the second conductive layer.

Embodiments will be described hereinafter with reference to the accompanying drawings.

Note that the disclosure is merely an example, and proper changes within the spirit of the invention, which are easily conceivable by a skilled person, are included in the scope of the invention as a matter of course. In addition, in some cases, in order to make the description clearer, the widths, thicknesses, shapes, etc., of the respective parts are schematically illustrated in the drawings, compared to the actual modes. However, the schematic illustration is merely an example, and adds no restrictions to the interpretation of the invention. Besides, in the specification and drawings, the same or similar elements as or to those described in connection with preceding drawings or those exhibiting similar functions are denoted by like reference numerals, and a detailed description thereof may be omitted unless otherwise necessary.

A semiconductor device 1 of this embodiment is applicable to various display devices such as liquid crystal displays, organic electroluminescent displays, electrophoretic displays, and LED displays, as well as various sensors such as capacitive sensors and optical sensors, and other electronic devices.

FIG. 1 is a cross-sectional view showing a configuration example of a semiconductor device 1 of this embodiment.

The semiconductor device 1 has a base 10, insulating layers 11 to 15, transistors TR1 and TR2, and a connection electrode CN. For example, the insulating layer 11 corresponds to the first insulating layer, the insulating layers 12 to 14 correspond to an intermediate insulating layers, the insulating layer 15 corresponds to the second insulating layer, and the insulating layer 14 corresponds to the third insulating layer.

The transistor TR1 comprises a semiconductor (first semiconductor) SC1 and a gate electrode GE1. The semiconductor SC1 is, for example, a polycrystalline silicon semiconductor, but it may be some other silicon-based semiconductor. The gate electrode GE1 is an electrode electrically connected to a gate line.

The transistor TR2 comprises a semiconductor SC2 (second semiconductor) and a gate electrode GE2. The semiconductor SC2 is, for example, an oxide semiconductor. The gate electrode GE2 is an electrode electrically connected to a gate line.

The connection electrode CN is an electrode that electrically connects the transistor TR1 and the transistor TR2 directly to each other. The connection electrode CN functions as either one of the source electrode or the drain electrode of the transistor TR1. The connection electrode CN also functions as either one of the source electrode and drain electrode of the transistor TR2. Note that in the transistor TR1, an electrode connected to an opposite side thereof to the connection electrode CN while interposing the gate electrode GE1 therebetween (that is, the other one of the source electrode and the drain electrode) is omitted from the illustration. Further, in the transistor TR2, an electrode connected to an opposite side thereof to the connection electrode CN while interposing the gate electrode GE2 therebetween (that is, the other one of the source electrode and the drain electrode) is omitted from the illustration.

The base 10 is an insulating substrate and is formed of an insulating material such as glass, resin film or the like. The insulating layer 11 is disposed above the base 10.

The semiconductor SC1 is disposed above the insulating layer 11. The insulating layer 12 is disposed above the insulating layer 11 and covers the semiconductor SC1.

The gate electrode GE1 is located directly above the semiconductor SC1, disposed on the insulating layer 12 and covered by the insulating layer 13. A light-shielding layer LS is provided to correspond to the transistor TR2, disposed on the insulating layer 12 and covered by the insulating layer 13. In other words, the gate electrode GE1 and the light-shielding layer LS are metal layers located in the same layer and formed of the same material. The insulating layer 14 is disposed on the insulating layer 13.

The semiconductor SC2 is located directly above the light-shielding layer LS and disposed on the insulating layer 14. The insulating layer 15 is disposed on the insulating layer 14 and covers the semiconductor SC2. In other words, in the example shown in FIG. 1, the insulating layers 12 to 14, which are intermediate insulating layers, are interposed between the semiconductor SC1 and the semiconductor SC2. The intermediate insulating layers are disposed on the semiconductor SC1 and the semiconductor SC2 is disposed on the intermediate insulating layers.

The gate electrode GE2 is located directly above the semiconductor SC2 and is disposed on the insulating layer 15. The gate electrode GE2 is at the same potential as that of the light-shielding layer LS, for example. The connection electrode CN is located above the insulating layer 15. In other words, the gate electrode GE2 and the connection electrode CN are metal layers located in the same layer and formed of the same material.

The connection electrode CN is electrically connected to the semiconductor SC1 in a first contact hole CH1 which penetrates the insulating layers 12 to 15. Further, the connection electrode CN is electrically connected as well to the semiconductor SC2 in a second contact hole CH2 which penetrates the insulating layer 15.

The connection electrode CN is constituted by a stacked body of the first conductive layer L1 and the second conductive layer L2. The second conductive layer L2 is stacked on the first conductive layer L1. The first conductive layer L1 is in contact with the semiconductor SC1 via the first contact hole CH1, and also in contact with the semiconductor SC2 via the second contact hole CH2. Further, the first conductive layer L1 includes an extending portion EX which extends from a position in contact with the semiconductor SC2 in the first contact hole CH1 toward the gate electrode GE2.

The second conductive layer L2 is stacked on the first conductive layer L1 between the first contact hole CH1 and the second contact hole CH2. In the example shown in FIG. 1, the second conductive layer L2 further extends to the transistor TR1 and is stacked on the first conductive layer L1 in the first contact hole CH1. The second conductive layer L2 is not in contact with the semiconductor SC1 in the first contact hole CH1. An end surface S1 of the second conductive layer L2 on a transistor TR1 side is located on a gate electrode GE1 side with respect to the position overlapping the first contact hole CH1.

On the other hand, the second conductive layer L2 does not extend to the transistor TR2 and is not stacked on the first conductive layer L1 in the second contact hole CH2. That is, an end surface S2 of the second conductive layer L2 on a transistor TR2 side does not overlap the second contact hole CH2. Further, the second conductive layer L2 is not stacked on the extending portion EX.

The gate electrode GE2 is configured as a stacked body similar to that of the connection electrode CN. That is, the gate electrode GE2 comprises a first layer L11 formed of the same material as that of the first conductive layer L1, and a second layer L12 formed of the same material as that of the second conductive layer L2. The second layer L12 is stacked on the first layer L11.

Directly above the insulating layer 15, a film thickness T1 of the first conductive layer L1 is less than a film thickness T2 of the second conductive layer L2 (T1<T2). The film thickness T2 of the second conductive layer L2 is three times or more than the film thickness T1 of the first conductive layer L1. For example, the film thickness T1 is about 30 nm and the film thickness T2 is T2 is about 100 nm.

The first conductive layer L1 is formed of a material different from that of the second conductive layer L2. In selecting the material for each of the first and second conductive layers, it is desirable that the density of the material which forms the first conductive layer L1 is lower than the density of the material which forms the second conductive layer L2. For example, the material of the first conductive layer L1 contains at least one of titanium (Ti) and aluminum (Al), and the material of the second conductive layer L2 contains at least one of molybdenum (Mo) and tungsten (W).

However, since the first conductive layer L1 is in contact with the semiconductor SC2, which is an oxide semiconductor, it is desirable that it be formed of a material that is not easily oxidized. For example, the first conductive layer L1 should preferably be a single layer of titanium-based material or a stacked body in which an aluminum-based layer is stacked on a titanium-based layer.

The insulating layers 11 to 15 are, for example, transparent inorganic insulating layers formed of silicon nitride (SiN), silicon oxide (SiO) and the like. The insulating layers 11 to 15 may each be a single layer formed of a single insulating material or may be a stacked body formed from multiple insulating materials.

For example, the insulating layer 11 is a stacked body of a silicon nitride and a silicon oxide, the insulating layer 12 is formed of silicon oxide, the insulating layer 13 is formed of silicon nitride, and the insulating layers 14 and 15 are formed of silicon oxide.

Next, an example of a method of manufacturing the transistors TR1 and TR2 shown in FIG. 1 will be described.

FIGS. 2 to 5 illustrate the method of manufacturing the transistors TR1 and TR2. In the cross-sectional views shown in FIGS. 2 to 5, the base 10 is omitted from the illustration.

First, as shown in FIG. 2, the insulating layer 11, the semiconductor (polycrystalline silicon semiconductor) SC1, the insulating layer 12, the gate electrode GE1, the light-shielding layer LS, the insulating layers 13 and 14, the semiconductor (oxide semiconductor) SC2 and the insulating layer 15 are formed in order.

Note that, before forming the semiconductor SC2, an impurity is implanted to the semiconductor SC1 using the gate electrode GE1 as a mask. Here, the impurity implanted is, for example, phosphorus (P) in the case of n-channel type, whereas boron (B) in the case of p-channel type.

After forming insulating layer 15, the first contact hole CH1 which penetrates the insulating layers 12 to 15 to the semiconductor SC1, and the second contact hole CH2 which penetrates the insulating layer 15 to the semiconductor SC2 are formed. In the first contact hole CH1, a part of the semiconductor SC1 is exposed, and in the second contact hole CH2, a part of the semiconductor SC2 is exposed.

Then, as shown in FIG. 3, a metal film is formed on the insulating layer 15, and the metal film is patterned, thus forming the first conductive layer L1 of the connection electrode CN and the first layer L11 of the gate electrode GE2. The first conductive layer L1 is in contact with the semiconductor SC1 in the first contact hole CH1, and in contact with the semiconductor SC2 in the second contact hole CH2, and further includes an extending portion EX. The first layer L11 is located directly above the semiconductor SC2 and is spaced apart from the first conductive layer L1. In the region of the semiconductor SC2, which is in contact with the first conductive layer L1, oxygen is absorbed by the first conductive layer L1, thus lowering the resistance.

Next, as shown in FIG. 4, after forming a metal film, the metal film is patterned, thus forming the second conductive layer L2 of the connection electrode CN and the second layer L12 of the gate electrode GE2. The second conductive layer L2 overlaps the first conductive layer L1 in the first contact hole CH1, and further overlaps the first conductive layer L1 between the first contact hole CH1 and the second contact hole CH2. The second layer L12 overlaps the first layer L11 and is spaced apart from the second conductive layer L2.

Subsequently, as shown in FIG. 5, ion implantation is carried out on the semiconductor SC2 using the gate electrode GE2 as a mask. For example, boron (B) is implanted to the semiconductor SC2 as the impurity by the ion implantation. In place of boron, some other impurity such as phosphorus (P) may be implanted to the semiconductor SC2.

In such ion implantation, the second conductive layer L2 and the second layer L12, which have relatively high-density and is relatively thick, have a high ability to block the implantation of impurities. Therefore, in the region directly under the gate electrode GE2, which is a stacked body of the first layer L11 and the second layer L12, substantially no impurities are implanted.

On the other hand, impurities are implanted to the region directly under the first conductive layer L1, which is thin and the region where the insulating layer 15 is exposed. Especially, the first conductive layer L1 is formed of a relatively low-density material, and therefore, impurities easily permeate therethrough. With this configuration, impurities can be easily implanted to, for example, the region directly below the extending portion EX, including the region where the insulating layer 15 is covered only by the first conductive layer L1. Therefore, in the semiconductor SC2, impurities are implanted to the region directly under the extending portion EX and the region between the first conductive layer L1 and the gate electrode GE2, and thus the resistance of these regions are lowered.

Incidentally, as described above, when the transistor TR1 is of an n-channel type, the impurity to be implanted to the semiconductor SC1 is phosphorus. Here, when boron is to be implanted as an impurity to the semiconductor SC2, the impurity contained in the semiconductor SC1 is different in type from that of the semiconductor SC2. Therefore, when implanting an impurity to the semiconductor SC2, it is necessary to protect the semiconductor SC1 from being implanted with the impurity (boron). Thus, in the first contact hole CH, the second conductive layer L2 is stacked on the first conductive layer L1.

Further, as in the case where the semiconductor SC1 of the p-channel transistor TR1 contains boron as an impurity and phosphorus is to be implanted as an impurity to the semiconductor SC2, for the purpose of suppressing undesired impurities from being implanted to the semiconductor SC2, the second conductive layer L2 is stacked on the first conductive layer L1 in the first contact hole CH1.

In the case where the impurity contained in the semiconductor SC1 is the same in type as that of the semiconductor SC2, the second conductive layer L2 of the first contact hole CH1 may be omitted. For example, in the case where the impurity contained in the semiconductor SC1 is phosphorus and phosphorus is to be implanted as an impurity to the semiconductor SC2, or the case where the impurity contained in the semiconductor SC1 is boron and boron is to be implanted as an impurity to the semiconductor SC2, the second conductive layer L2 of the first contact hole CH1 may be omitted.

FIG. 6 is a cross-sectional view showing the semiconductor SC2 after implanting the impurity.

The semiconductor SC2 includes regions A1 to A5. Each of these regions will now be described in detail.

The region (first region) A1 is located directly under the gate electrode GE2. The region (second region) A2 is located directly under the extending portion EX. The region (third region) A3 is located between the region A1 and the region A2 and is connected to the regions A1 and A2. The region A4 is located on an opposite side to the region A3 while interposing the region A1 therebetween. In other words, the region A1 is located between the region A3 and the region A4, and is connected to the regions A3 and A4. The region A3 and the region A4 overlap the region of the insulating layer 15, which is exposed from the first conductive layer L11 and the first layer L11. The region A5 is a region in contact with the first conductive layer L1 in the second contact hole CH2.

The impurity concentration of each of the regions A2 to A5 is higher than that of the region A1. Note that the impurity concentrations of the regions A2 to A5 are substantially equal to each other. For example, boron (B) is implanted as an impurity in each of the regions A2 to A5, whereas in the region A1, boron (B) is no substantially implanted. That is, the region A1 corresponds to the channel region of the semiconductor SC2. The impurity concentration in this specification can be expressed as the number of impurity ions (atoms) per unit volume. Note that as to oxide semiconductors, a high impurity concentration means a large number of oxygen defects per unit volume or a large number of defects per unit volume.

From another point of view, in the semiconductor SC2, the regions A2 to A5 each have a resistance lower than that of the region A1. The resistance values of the regions A2 to A4 are substantially equal to each other. The region A5 is in contact with the first conductive layer L1, and has a resistance even lower than that of the region A2.

Next, the impurity concentrations in portions P1 and P2 encircled by dotted lines in the cross-sectional view shown in FIG. 6 were calculated by simulation. In this simulation, the concentration of boron was calculated as the impurity concentration.

The portion P1 is a region where the extending portion EX of the first conductive layer L1, the insulating layer 15, the region A2 of the semiconductor SC2 and the insulating layer 14 are stacked.

The portion P2 is a region where the first conductive layer L1 is not formed and further the insulating layer 15, the region A3 of the semiconductor SC2 and the insulating layer 14 are stacked.

FIG. 7 is a diagram showing results of the first simulation. Here, the acceleration energy at the time of the ion implantation is set to 30 keV, and the ion dosage is set to $1\times10^{15}$ ions/cm$^2$.

The horizontal axis of the figure indicates the distance (nm) in the depth direction with respect to the interface between the insulating layer 15 and the semiconductor SC2. As to the position in the depth direction, the left direction of the graph corresponds to the upper direction of the portions P1 and P2, and the right direction of the graph corresponds to the lower direction of the portions P1 and P2. In the upper part of the graph, the range of the extending portion EX is represented by "EX", the range of the insulating layer 15 is represented by "15", the range of the semiconductor SC2 is represented by "SC2", and the range of the insulating layer 14 is represented by "14".

The film thickness of the extending portion EX is about 30 nm, the film thickness of the insulating layer 15 is about 100 nm, and the film thickness of the semiconductor SC2 is about 50 nm.

The vertical axis of the figure indicates the concentration of the boron impurity (atoms/cm$^3$).

The diagram shows the simulation results B1 of the portion P1 and the simulation results B2 of the portion P2.

According to the results of the first simulation shown in FIG. 7, the impurity concentration of the semiconductor SC2 (the region A2) in the portion P1 is lower than that of the semiconductor SC2 (the region A3) in the portion P2; however, it has been confirmed that impurities of a concentration sufficient to lower the resistance of the region A2 located directly under the extending portion EX can be implanted to the region A2.

FIG. 8 is a diagram showing results of the second simulation. Here, the acceleration energy at the time of the ion implantation is set to 50 keV, and the ion dosage is set to $1\times10^{15}$ ions/cm$^2$. The diagram shows the simulation results B1 of the portion P1 and the simulation results B2 of the portion P2.

According to the results of the second simulation shown in FIG. 8, the impurity concentration of the semiconductor SC2 (the region A2) in the portion P1 is higher than that of the semiconductor SC2 (the region A3) in the portion P2. In the results of the second simulation as well, it has been confirmed that impurities of a concentration sufficient to lower the resistance of the region A2 located directly under the extending portion EX can be implanted to the region A2. It has been also confirmed that the balance of impurity concentration in the regions of the semiconductor SC2 can be adjusted by adjusting the acceleration energy.

As described above, the connection electrode CN, which electrically connects the semiconductor SC1, which is a polycrystalline silicon semiconductor and the semiconductor SC2, which is an oxide semiconductor, directly to each other, is configured as a stacked body of the first conductive layer L1 which is thin and the second conductive layer L2 which is thick. Note that the second conductive layer L2 is not provided in a region on a gate electrode GE2 side with respect to the second contact hole CH2 where the first conductive layer L1 and the semiconductor SC2 are in contact with each other.

When a thick-film connection electrode CN is formed, the extending portion EX located on the gate electrode GE2 side with respect to the second contact hole CH2 serves as an eaves, which may interfere with the implantation of an impurity to the region A2 directly below the extending portion EX when the ion implantation is carried out on the semiconductor SC2. In this case, the resistance of the region A2 is not sufficiently lowered and the desired performance of the transistor TR2 cannot be obtained.

According to this embodiment described above, when ion implantation is carried out on the semiconductor SC2, the impurity is implanted to the regions A2 and A3 between the contact position between the first conductive layer L1 and the semiconductor SC2 and the region A1 which is the channel region, and the resistances of the regions A2 and A3 can be lowered. Thus, a transistor TR2 with the desired performance can be provided.

Further, in the first contact hole CH1, where the first conductive layer L1 and the semiconductor SC1 come into contact with each other, the second conductive layer L2 is provided. Therefore, even if the impurity implanted to the semiconductor SC1 and that implanted to the semiconductor SC2 are different from each other in type, the implantation of different impurities to the semiconductor SC1 can be suppressed. With this configuration, the increase in the contact resistance between the semiconductor SC1 and the connection electrode CN can be suppressed. Therefore, the decrease in the drive capability of the transistor TR1 can be suppressed. Furthermore, it is not necessary to provide a separate processing step for suppressing undesired impurity implantation to the semiconductor SC1, and the increase in manufacturing cost can be suppressed.

FIG. 9 is a cross-sectional view showing another configuration example of the semiconductor device 1 of this embodiment.

The configuration example shown in FIG. 9 is different from that of FIG. 1 in the second conductive layer L2. Note that the first conductive layer L1 is, as in the case of the configuration example of FIG. 1, in contact with the semiconductor SC1 via the first contact hole CH1 and also in contact with the semiconductor SC2 via the second contact hole CH2. Further, the first conductive layer L1 includes an extending portion EX extending from a position in contact with the semiconductor SC2 in the first contact hole CH1 towards the gate electrode GE2.

The second conductive layer L2 is stacked on the first conductive layer L1 between the first contact hole CH1 and the second contact hole CH2, and stacked on the first conductive layer L1 in the first contact hole CH1 and further stacked on the first conductive layer L1 in the second contact hole CH2. Note that the second conductive layer L2 is not stacked on the extending portion EX. In other words, the end surface S2 of the second conductive layer L2 on the transistor TR2 side overlaps the second contact hole CH2.

In the example with such a configuration, impurity implantation to the region A5 in the semiconductor SC2, which overlaps the second contact hole CH2, is suppressed. The region A5 is in contact with the connection electrode CN, therefore the oxygen in the region A5 is absorbed by the connection electrode CN, and therefore the resistance of the region A5 is sufficiently lowered.

In the example with such a configuration as well, the second conductive layer L2 is not stacked on the extending portion EX, and therefore advantageous effects similar to those of the configuration examples provided above can be obtained.

FIG. 10 is a cross-sectional view showing another configuration example of the semiconductor device 1 of this embodiment.

The configuration example shown in FIG. 10 is different from that of FIG. 1 in the second conductive layer L2. More specifically, the second conductive layer L2 is stacked on the first conductive layer L1 between the first contact hole CH1 and the second contact hole CH2.

On the other hand, the second conductive layer L2 is not extended to the transistor TR1, and the second conductive layer L2 is not stacked on the first conductive layer L1 in the first contact hole CH1. In other words, the end surface S1 of the second conductive layer L2 on the transistor TR1 side does not overlap the first contact hole CH1. Further, the second conductive layer L2 is not stacked on the first conductive layer L1 in the second contact hole CH2, and also not stacked on the extending portion EX.

In the example with such a configuration, the impurity contained in the semiconductor SC1 is the same in type as that contained in the semiconductor SC2. Therefore, even if the same type of impurity as that of the semiconductor SC2 is implanted to the semiconductor SC1 while implanting the impurity to the semiconductor SC2, the performance of the transistor TR1 is not deteriorated.

In the example with such a configuration as well, the second conductive layer L2 is not stacked on the extending portion EX, and therefore advantageous effects similar to those of the configuration examples provided above can be obtained.

According to the embodiments, it is possible to provide a semiconductor device which can suppress the degradation in performance of the transistor.

Based on the semiconductor device which has been described in the above-described embodiments, a person having ordinary skill in the art may achieve a semiconductor device with an arbitral design change; however, as long as they fall within the scope and spirit of the present invention, such a semiconductor device is encompassed by the scope of the present invention.

A skilled person would conceive various changes and modifications of the present invention within the scope of the technical concept of the invention, and naturally, such changes and modifications are encompassed by the scope of the present invention. For example, if a skilled person adds/deletes/alters a structural element or design to/from/in the above-described embodiments, or adds/deletes/alters a step or a condition to/from/in the above-described embodiment, as long as they fall within the scope and spirit of the present invention, such addition, deletion, and altercation are encompassed by the scope of the present invention.

Furthermore, regarding the present embodiments, any advantage and effect those will be obvious from the description of the specification or arbitrarily conceived by a skilled person are naturally considered achievable by the present invention.

What is claimed is:

1. A semiconductor device comprising:

an insulating substrate;

a first insulating layer disposed above the insulating substrate;

a polycrystalline silicon semiconductor disposed on the first insulating layer;

an intermediate insulating layer disposed on the polycrystalline silicon semiconductor;

an oxide semiconductor disposed on the intermediate insulating layer;

a second insulating layer disposed on the intermediate insulating layer and the oxide semiconductor;

a gate electrode disposed on the second insulating layer and located directly above the oxide semiconductor;

a first conductive layer in contact with the polycrystalline silicon semiconductor via a first contact hole penetrating the intermediate insulating layer and the second insulating layer, and in contact with the oxide semiconductor via a second contact hole penetrating the second insulating layer, the second contact hole exposing the oxide semiconductor; and a second conductive layer stacked on the first conductive layer between the first contact hole and the second contact hole, wherein the first conductive layer includes an extending portion extending from the second contact hole toward the gate electrode, the second conductive layer is not stacked on the extending portion, a film thickness of the first conductive layer directly above the second insulating layer is less than a film thickness of the second conductive layer above the second insulating layer, the film thickness of the second conductive layer directly above the second insulating layer is three times or more than the film thickness of the first conductive layer above the second insulating layer, the first conductive layer is formed of a material different from that of the second conductive layer, a density of the first conductive layer is less than one half of a density of the second conductive layer, the second conductive layer includes a first end surface and a second end surface, the first end surface is located directly above the polycrystalline silicon semiconductor, and the second end surface is located directly above the oxide semiconductor.

2. The semiconductor device of claim 1, wherein the first conductive layer contains at least one of titanium (Ti) and aluminum (Al), and the second conductive layer contains at least one of molybdenum (Mo) and tungsten (W).

3. The semiconductor device of claim 1, wherein the gate electrode is a stacked body comprising a first layer formed of a same material as that of the first conductive layer and a second layer formed of a same material as that of the second conductive layer.

4. The semiconductor device of claim 1, wherein the oxide semiconductor includes a first region directly under the gate electrode, a second region directly under the extending portion and a third region between the first region and the second region, and impurity concentrations of the second region and the third region are higher than an impurity concentration of the first region.

5. The semiconductor device of claim 1, wherein the second conductive layer is stacked on the first conductive layer in the second contact hole.

6. The semiconductor device of claim 1, wherein the second conductive layer is stacked on the first conductive layer in the first contact hole.

7. The semiconductor device of claim 6, wherein impurity ions contained in the polycrystalline silicon semiconductor are different in type from impurity ions contained in the oxide semiconductor.

8. The semiconductor device of claim 1, wherein the second conductive layer is not stacked on the first conductive layer in the first contact hole, and impurity ions contained in the polycrystalline silicon semiconductor are the same in type as impurity ions contained in the oxide semiconductor.

9. The semiconductor device of claim 1, wherein the second conductive layer is stacked on the first conductive layer in the first contact hole and is not stacked on the first conductive layer in the second contact hole.

10. The semiconductor device of claim 1, wherein
the second conductive layer is stacked on the first con-
ductive layer in the first contact hole and the second
contact hole.

11. The semiconductor device of claim 1, wherein
the second conductive layer is not stacked on the first
conductive layer in the first contact hole and the second
contact hole.

12. The semiconductor device of claim 1, wherein
the intermediate insulating layer includes a third insulat-
ing layer in contact with the oxide semiconductor, and
the second insulating layer and the third insulating layer
are formed of silicon oxide.

13. The semiconductor device of claim 1, wherein
the second conductive layer is not stacked on a part of the
extending portion that contacts the oxide semiconduc-
tor.

14. The semiconductor device of claim 1, wherein
the second conductive layer is not stacked on the first
conductive layer over the second contact hole.

15. The semiconductor device of claim 1, wherein
the film thickness at any portion of the second conductive
layer is greater than the film thickness of the first
conductive layer directly under that portion.

16. The semiconductor device of claim 1, wherein
the oxide semiconductor includes a channel region over-
lapping the gate electrode, and
the second insulating layer does not include a contact hole
between the channel region and the gate electrode.

17. The semiconductor device of claim 16, wherein
the second insulating layer is sandwiched between the
extending portion and the oxide semiconductor, and is
sandwiched between the gate electrode and the oxide
semiconductor.

18. The semiconductor device of claim 1, wherein
the second insulating layer is an inorganic insulating
layer.

* * * * *